(12) United States Patent
Lee

(10) Patent No.: US 11,688,439 B2
(45) Date of Patent: Jun. 27, 2023

(54) INTEGRATED CIRCUIT HAVING DATA OUTPUT CIRCUIT AND SEMICONDUCTOR MEMORY SYSTEM INCLUDING THE SAME

(71) Applicant: SK hynix Inc., Icheon-si (KR)

(72) Inventor: Dong Heon Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/488,863

(22) Filed: Sep. 29, 2021

(65) Prior Publication Data

US 2022/0358977 A1 Nov. 10, 2022

(30) Foreign Application Priority Data

May 10, 2021 (KR) .......................... 10-2021-0060050

(51) Int. Cl.
*G11C 8/00* (2006.01)
*G11C 7/10* (2006.01)

(52) U.S. Cl.
CPC .................................. *G11C 7/1066* (2013.01)

(58) Field of Classification Search
CPC ..................................................... G11C 7/1066
USPC ......................................................... 365/233.1
See application file for complete search history.

(56) References Cited

U.S. PATENT DOCUMENTS

2022/0131544 A1* 4/2022 Kang ................. H03K 19/0963

FOREIGN PATENT DOCUMENTS

KR 1020200005212 A 1/2020

* cited by examiner

*Primary Examiner* — Hoai V Ho
(74) *Attorney, Agent, or Firm* — William Park & Associates Ltd.

(57) ABSTRACT

An integrated circuit includes a drivability control circuit and a data output circuit. The drivability control circuit is configured to generate a drivability control signal based on data patterns of a plurality of pieces of data. The data output circuit is configured to control drivability, which is reflected to each of the plurality of pieces of data, based on the drivability control signal.

18 Claims, 10 Drawing Sheets

US 11,688,439 B2

INTEGRATED CIRCUIT HAVING DATA OUTPUT CIRCUIT AND SEMICONDUCTOR MEMORY SYSTEM INCLUDING THE SAME

CROSS-REFERENCES TO RELATED APPLICATION

The present application claims priority under 35 U.S.C. § 119(a) to Korean application number 10-2021-0060050, filed on May 10, 2021, in the Korean Intellectual Property Office, which is incorporated herein by reference in its entirety.

BACKGROUND

1. Technical Field

Various embodiments may generally relate to an integrated circuit and a semiconductor memory system, and more particularly, to an integrated circuit which outputs data based on an internal dock signal and a semiconductor memory system including the same.

2. Related Art

In general, integrated circuits including semiconductor apparatuses and semiconductor memory apparatuses may perform various circuit operations by receiving signals from an external host apparatus. The integrated circuits may output data obtained through the various circuit operations. Data output circuits may be used to output the data, and the integrated circuits may be mounted with the data output circuits.

Jitter may occur in data input to the integrated circuit and data output from the integrated circuit due to various reasons. Jitter in data may refer to a phenomenon for which deviation of the time that the data is transited from a logic 'low (I)' level to a logic 'high (H)' level or that the data is transited from the logic 'H' level to the logic level occurs. When jitter occurs in data, the data reliability may be degraded.

There are three reasons that cause jitter in data.

The first reason is that jitter occurs due to a system influence. Jitter due to the system influence may occur depending on an operation and a configuration of the system, and may be caused by crosstalk, impedance mismatching, and the like. The second reason is that jitter occurs due to data itself. Jitter due to data itself may occur depending on patterns of transmitted and received data, and may be caused by intersymbol interference, duty cycle distortion, and the like. The third reason is that jitter occurs due to ransom noise. Jitter due to random noise may occur depending on noise reflected to a signal, and may be caused by thermal noise, pink noise, and the like.

In recent years, so as to overcome the problems related to jitter occurring in data, a calibration circuit, an equalization circuit, and the like may be mounted on the inside of the integrated circuit. However, the calibration circuit or the equalization circuit may have a relatively large circuit dimension and a large consumed driving current. Thus, the calibration circuit or the equalization circuit may inevitably act as a burden factor in circuit design.

SUMMARY

In an embodiment of the present disclosure, an integrated circuit may include: a drivability control circuit configured to generate a drivability control signal corresponding to each of a plurality of pieces of data based on data patterns of the plurality of pieces of data; and a data output circuit configured to output the plurality of pieces of data sequentially based on an internal clock signal and control drivability, which is reflected to each of the plurality of pieces of data, based on the drivability control signal.

In an embodiment, the drivability control circuit may activate, when consecutive data of the same logic level are included in the data patterns of the plurality of pieces of data, a plurality of drivability control signals corresponding to the number of consecutive data of the same logic level.

In an embodiment of the present disclosure, a semiconductor memory system may include a host apparatus configured to provide step setting information. The semiconductor memory system may also include a semiconductor memory apparatus. The semiconductor memory apparatus may include a drivability control circuit configured to generate a drivability control signal corresponding to each of a plurality of pieces of data based on data patterns of the plurality of pieces of data. The semiconductor memory apparatus may additionally include a data output circuit configured to output the plurality of pieces of data sequentially based on an internal dock signal and control drivability, which is reflected to each of the plurality of pieces of data, based on the drivability control signal. A drivability control step of the semiconductor memory apparatus may be set based on the step setting information.

BRIEF DESCRIPTION OF THE DRAWINGS

The above and other aspects, features, and advantages of the subject matter of the present disclosure will be more dearly understood from the following detailed description taken in conjunction with the accompanying drawings, in which.

DETAILED DESCRIPTION

Figure 1:
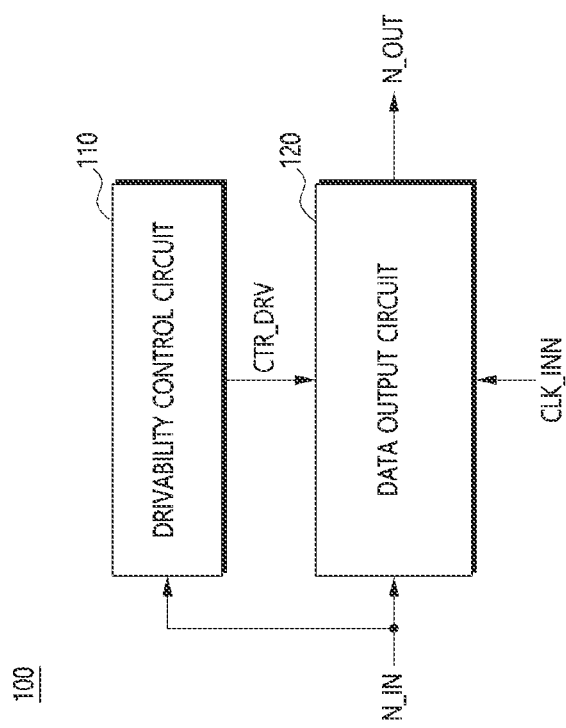
FIG. 1 is a block diagram illustrating a configuration of an integrated circuit according to an embodiment of the preset disclosure.

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the teems described herein should be understood as follows.

The terms, such as the "first" and the "second," are used to distinguish one element from another element, and the scope of the present disclosure should not be limited by the terms. For example, a first element could be termed a second element, and, similarly, a second element could be termed a first element.

An expression of the singular should be understood as also including plural expressions, unless clearly expressed otherwise in the context. Terms, such as "include" or "have," should be understood as indicating the existence of a set feature, integer, step, operation, element, part, or a combination thereof, not excluding a possibility of the existence or addition of one or more other features, integers, steps, operations, elements, parts, or a combination thereof.

In each of the steps, symbols (e.g., a, b, and c) are used for convenience of description, and the symbols do not describe order of the steps. The steps may be performed in order different from order described in the context unless specific order is clearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Embodiments are provided to an integrated circuit capable of outputting a plurality of pieces of data by controlling drivability according to data patterns of the plurality of pieces of data and a semiconductor memory system including the same.

According to embodiments of the present disclosure, drivability may be controlled according to data patterns of a plurality of pieces of data, and thus jitter reflected to a plurality of pieces of output data may be reduced or minimized.

FIG. 1 is a block diagram illustrating a configuration of an integrated circuit 100 according to an embodiment.

Referring to FIG. 1, the integrated circuit 100 may include a drivability control circuit 110 and a data output circuit 120.

The drivability control circuit 110 may be configured to generate a drivability control signal CTR_DRV corresponding to each of a plurality of pieces of data based on data patterns of the plurality of pieces of data. For example, the plurality of pieces of data may be input in series through one data input terminal N_IN. In another example, the plurality of pieces of data may be input in parallel through a plurality of data input terminals. Detailed description therefor will be made below with reference to FIG. 2.

The data output circuit 120 may be configured to sequentially output the plurality of pieces of data based on an internal clock signal CLK_INN. The data output circuit 120 may receive the plurality of pieces of data through the data input terminal N_IN and may sequentially output the plurality of pieces of data through an output terminal N_OUT. The data output circuit 120 may control drivability reflected to each of the plurality of pieces of data based on the drivability control signal CTR_DRV.

Although not shown in the drawings, a predriver and a main driver may be coupled to the output terminal N_OUT. The plurality of pieces of data output through the output terminal N_OUT may be finally output to the outside the integrated circuit 100 through an output pad via the predriver and the main driver.

The integrated circuit 100 according to an embodiment may control the drivability of the data output circuit 120, which is reflected to each of the plurality of pieces of data, based on the data patterns of the plurality of pieces of data.

Figure 2:
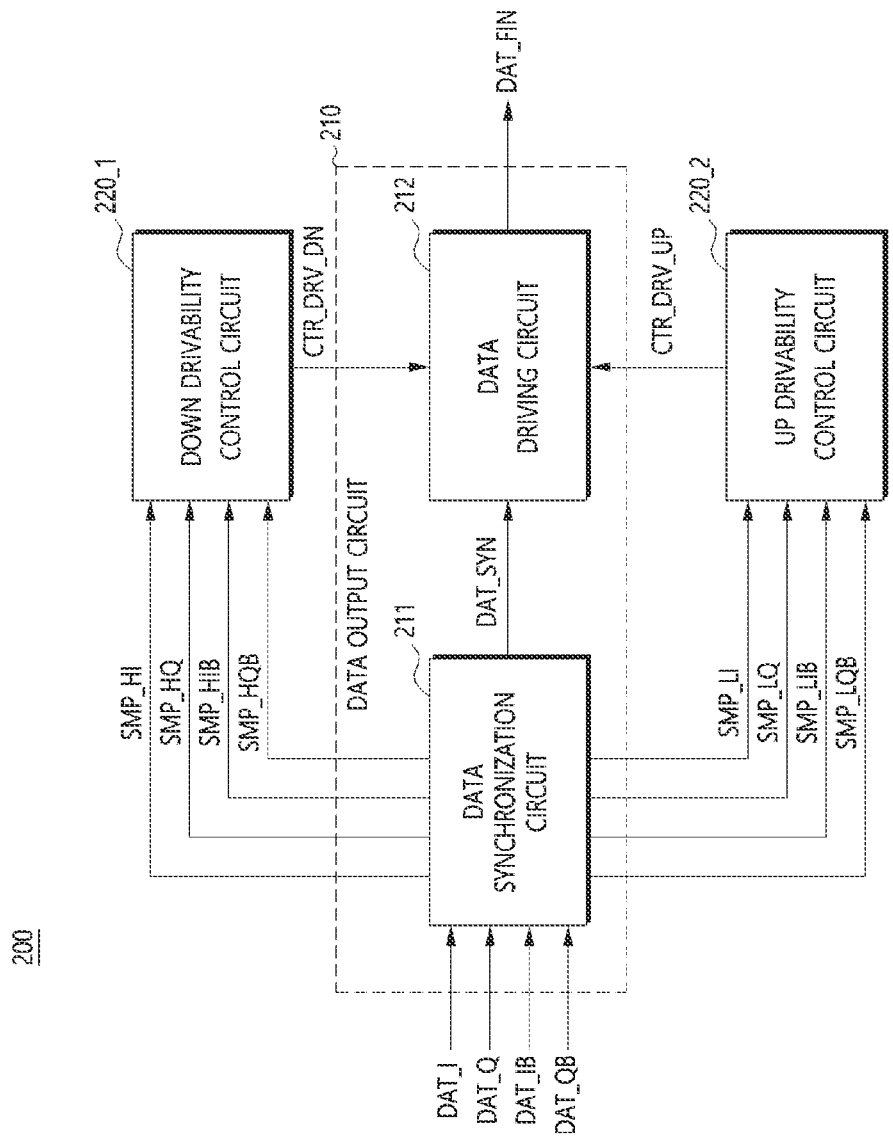
FIG. 2 is a block diagram illustrating a configuration of an integrated circuit according to an embodiment of the preset disclosure.

FIG. 2 is a block diagram illustrating a configuration of an integrated circuit 200 according to an embodiment.

Referring to FIG. 2, the integrated circuit 200 may include a data output circuit 210 and drivability control circuits 220_1 and 220_2. It is illustrated in FIG. 2 that four pieces of data as the plurality of pieces of data are input in parallel to the integrated circuit 200. For example, the plurality of pieces of data may include first to fourth data DAT_I, DAT_Q, DAT_IB, and DAT_QB input in parallel. The internal clock signal may include a plurality of phase clock signals which correspond to the first to fourth data DAT_I, DAT_Q, DAT_IB, and DAT_QB and have different phases from each other. For example, the internal clock signal may include first to fourth phase clock signals CLK_I, CLK_Q, CLK_IB, and CLK_QB (see FIG. 3). In this example, the first to fourth phase clock signals CLK_I, CLK_Q, CLK_IB, and CLK_QB may have a 90° phase difference.

The data output circuit 210 may be configured to sequentially output the first to fourth data DAT_I, DAT_Q, DAT_IB, and DAT_QB based on the first to fourth phase clock signals CLK_I, CLK_Q, CLK_IB, and CLK_QB. The data output circuit 210 may receive the first to fourth data DAT_I, DAT_Q, DAT_IB, and DAT_QB and finally output final data DAT_FIN. The data output circuit 210 may be configured to control the drivability reflected to each of the first to fourth data DAT_I, DAT_Q, DAT_IB, and DAT_QB based on an up drivability control signal CTR_DRV_UP and a down drivability control signal CTR_DRV_DN to be described later. For example, the data output circuit 210 may include a data synchronization circuit 211 and a data driving circuit 212.

First, the data synchronization circuit 211 may be configured to synchronize the plurality of pieces of data based on the plurality of phase clock signals. For example, the data synchronization circuit 211 may synchronize the first to fourth data DAT_I, DAT_Q, DAT_IB, and DAT_QB based on the first to fourth phase clock signals CLK_I, CLK_Q, CLK_IB, and CLK_QB.

The data synchronization circuit 211 to be described in detail with reference to FIG. 3 may generate first to fourth high sampling data SMP_HI, SMP_HQ, SMP_HIB, and SMP_HQB and first to fourth low sampling data SMP_LI, SMP_LQ, SMP_LIB, and SMP_LQB corresponding to the first to fourth data DAT_I, DAT_Q, DAT_IB, and DAT_QB through a sampling operation. For example, the first to fourth high sampling data SMP_HI, SMP_HQ, SMP_HIB, and SMP_HQB may include data for which logic 'H' levels of the first to fourth data DAT_I, DAT_Q, DAT_IB, and DAT_QB are sampled. The first to fourth low sampling data SMP_LI, SMP_LQ, SMP_LIB, and SMP_LQB may include data for which logic V levels of the first to fourth data DAT_I, DAT_Q, DAT_IB, and DAT_QB are sampled.

The data synchronization circuit 211 may generate synchronization data DAT_SYN through a coupling operation. The synchronization data DAT_SYN generated in the data synchronization circuit 211 may be provided to the data driving circuit 212 to be described later as an input signal.

Figure 3:
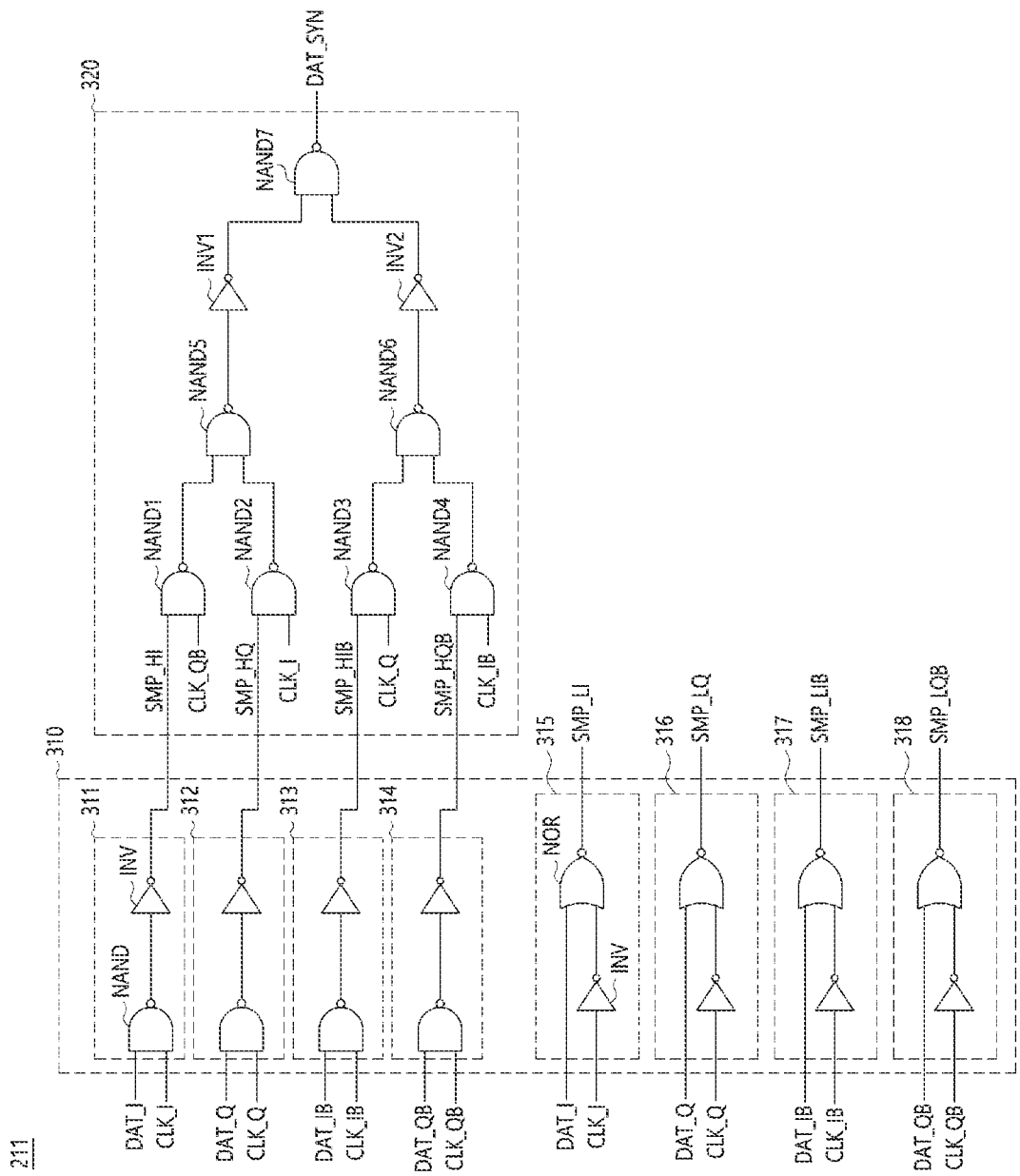
FIG. 3 is a circuit diagram illustrating a configuration of a data synchronization circuit of FIG. 2.

FIG. 3 is a circuit diagram illustrating a configuration of the data synchronization circuit 211 of FIG. 2.

Referring to FIG. 3, the data synchronization circuit 211 may include a sampling circuit 310 and a coupling circuit 320.

First, the sampling circuit 310 may be configured to generate a plurality of pieces of sampling data corresponding to logic levels of the plurality of pieces of data by sampling the plurality of pieces of data by the plurality of phase clock signals. For example, the sampling circuit 310 may generate the first to fourth high sampling data SMP_HI, SMP_HQ, SMP_HIB, and SMP_HQB corresponding to the logic 'H' levels of the first to fourth data DAT_I, DAT_Q, DAT_IB, and DAT_QB and the first to fourth low sampling data SMP_LI, SMP_LQ, SMP_LIB, and SMP_LQB corresponding to the logic 'L' levels of the first to fourth data DAT_I, DAT_Q, DAT_IB, and DAT_QB by sampling the first to fourth data DAT_I, DAT_Q, DAT_IB, and DAT_QB by the first to fourth phase clock signals CLK_I, CLK_Q, CLK_IB, and CLK_QB. In this example, the sampling circuit 310 may include first to eighth sampling circuits 311, 312, 313, 314, 315, 316, 317, and 318.

The first to fourth sampling circuits 311 to 314 may be configured to sample the logic 'H' levels of the first to fourth data DAT_I, DAT_Q, DAT_IB, and DAT_QB. The first to fourth sampling circuits 311 to 314 may be configured similarly to each other, and thus for clarity, the first sampling circuit 311 will be described as a representative.

The first sampling circuit 311 may be configured to generate the first high sampling data SMP_HI by sampling the first data DAT_I by the first phase clock signal CLK_I. For example, the first sampling circuit 311 may include a NAND gate NAND and an inverting gate INV.

The NAND gate NAND may receive the first data DAT_I and the first phase clock signal CLK_I, perform an NAND operation on the first data DAT_I and the first phase clock signal CLK_I, and output an NAND operation result as an output signal. The inverting gate INV may receive and invert the output signal of the NAND gate NAND and output an inverting result as the first high sampling data SMP_HI.

Through the above-described configuration, the first sampling circuit 311 may sample the logic 'H' level of the first data DAT_I to output the first high sampling data SMP_HI. Similarly, the second to fourth sampling circuits 312 to 314 may also sample the logic 'H' levels of the second to fourth data DAT_Q, DAT_IB, and DAT_QB to output the second to fourth high sampling data SMP_HQ, SMP_HIB, and SMP_HQB.

The fifth to eight sampling circuits 315 to 318 may be configured to sample the logic 'L' levels of the first to fourth data DAT_Q, DAT_IB, and DAT_QB. The fifth to eighth sampling circuits 315 to 318 may be configured similarly to each other, and thus for clarity, the fifth sampling circuit 315 will be described as a representative.

The fifth sampling circuit 315 may be configured to sample the first data DAT_I by the first phase clock signal CLK_I to generate the first low sampling data SMP_LI. For example, the fifth sampling circuit 315 may include an inverting gate INV and a NOR gate NOR.

The inverting gate INV may receive and invert the first phase dock signal CLK_I and output an inverting result. The NOR gate NOR may receive the first data DAT_I and an output signal of the inverting gate INV, perform a NOR operation on the first data DAT_I and the output signal of the inverting gate INV, and output a NOR operation result as the first low sampling data SMP_LI.

Through the above-described configuration, the fifth sampling circuit 315 may sample the logic 'L' level of the first data DAT_I to output the first low sampling data SMP_LI. Similarly, the sixth to eighth sampling circuits 316 to 318 may also sample the logic 'L' levels of the second to fourth data DAT_Q, DAT_IB, and DAT_QB to output the second to fourth low sampling data SMP_LQ, SMP_LIB, and SMP_LQB.

Next, the coupling circuit 320 may be configured to couple the output signals of the sampling circuit 310 to output the synchronization data DAT_SYN. For example, the coupling circuit 320 may couple the first to fourth high sampling data SMP_HI, SMP_HQ, SMP_LIB, and SMP_HQB output from the sampling circuit 310 and output a coupling result as the synchronization data DAT_SYN. In this example, the coupling circuit 320 may include first to seventh NAND gates NAND1, NAND2, NAND3, NAND4, NAND5, NAND6, and NAND7, and first to second inverting gates INV1 and INV2.

The first NAND gate NAND1 may receive the first high sampling data SMP_HI and the fourth phase dock signal CLK_QB, perform an NAND operation on the first high sampling data SMP_HI and the fourth phase clock signal CLK_QB, and output an NAND operation result as an output signal. The second NAND gate NAND2 may receive the second high sampling data SMP_HQ and the first phase dock signal CLK_I, perform an NAND operation on the second high sampling data SMP_HQ and the first phase clock signal CLK_I, and output an NAND operation result as an output signal. The third NAND gate NAND3 may receive the third high sampling data SMP_HIB and the second phase dock signal CLK_Q, perform an NAND operation on the third high sampling data SMP_HIB and the second phase dock signal CLK_Q, and output an NAND operation result as an output signal. The fourth NAND gate NAND4 may receive the fourth high sampling data SMP_HQB and the third phase clock signal CLK_IB, perform an NAND operation on the fourth high sampling data SMP_HQB and the third phase clock signal CLK_IB, and output an NAND operation result as an output signal. The fifth NAND gate NAND5 may receive the output signals of the first and second NAND gates NAND1 and NAND2, perform an NAND operation on the output signals of the first and second NAND gates NAND1 and NAND2, and output an NAND operation result as an output signal. The sixth NAND gate NAND6 may receive the output signals of the third and fourth NAND gates NAND3 and NAND4, perform an NAND operation on the output signals of the third and fourth NAND gates NAND3 and NAND4, and output an NAND operation result as an output signal. The first inverting gate INV1 may receive and invert the output signal of the fifth NAND gate NAND5 and output an inverting result as an output signal, and the second inverting gate INV2 may receive and invert the output signal of the sixth NAND gate NAND6 and output an inverting result as an output signal. The seventh NAND gate NAND7 may receive the output signals of the first and second inverting gates INV1 and INV2, perform an NAND operation on the output signals of the first and second inverting gates INV1 and INV2, and output an NAND operation result as the synchronization data DAT_SYN.

Through the above-described configuration, the coupling circuit 320 may couple the first to fourth high sampling data SMP_HI, SMP_HQ, SMP_HIB, and SMP_HQB and output the coupling result as the synchronization data DAT_SYN. The synchronization data DAT_SYN may be data that the first to fourth high sampling data SMP_HI, SMP_HQ, SMP_HIB, and SMP_HQB are arranged in series.

Accordingly, the data synchronization circuit 211 may generate the first to fourth high sampling data SMP_HI, SMP_HQ, SMP_HIB, and SMP_HQB and the first to fourth low sampling data SMP_LI, SMP_LQ, SMP_LIB, and SMP_LQB through the sampling operation. Further, the data synchronization circuit 211 may generate the synchronization data DAT_SYN that the first to fourth high sampling data SMP_HI, SMP_HQ, SMP_HIB, and SMP_HQB are coupled.

Referring back to FIG. 2, the data driving circuit 212 may be configured to drive the output signal DAT_SYN of the data synchronization circuit 211 by the drivability corresponding to the drivability control signal and output the driven output signal as the final data DAT_FIN. For example, the data driving circuit 212 may drive the synchronization data DAT_SYN as the output signal of the data synchronization circuit 211 by the drivability corresponding to the up drivability control signal CTR_DRV_UP and the down drivability control signal CTR_DRV_DN and output the final data DAT_FIN.

Figure 4:
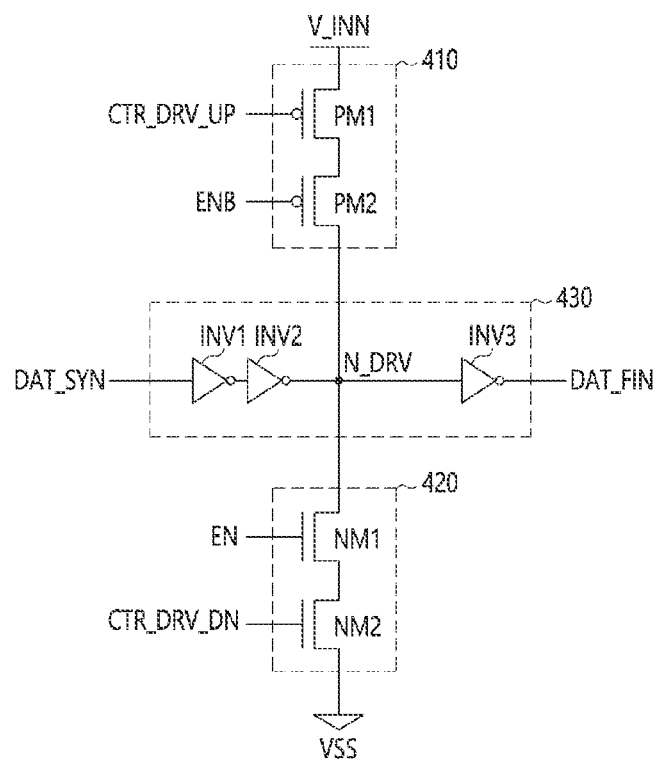
FIG. 4 is a circuit diagram illustrating a configuration of a data driving circuit of FIG. 2.

FIG. 4 is a circuit diagram illustrating a configuration of the data driving circuit 212 of FIG. 2.

Referring to FIG. 4, the data driving circuit 212 may include an up driving circuit 410 and a down driving circuit 420.

First, the up driving circuit 410 may be configured to control up drivability of a data moving path 430 based on the up drivability control signal CTR_DRV_UP. For example, the up driving circuit 410 may include first and second PMOS transistors PM1 and PM2.

The first PMOS transistor PM1 and the second PMOS transistor PM2 may be coupled in series between an inner power voltage terminal V_INN and a driving node N_DRV. An internal voltage, which is internally generated based on a power voltage transferred from the outside, may be applied to the internal power voltage terminal V_INN. The first PMOS transistor PM1 may turn on and turn off by receiving the up drivability control signal CTR_DRV_UP through a gate terminal thereof. Detailed description for the up drivability control signal CTR_DRV_UP will be made in detail with reference to FIG. 5. The second PMOS transistor PM2 may receive an inverted enable signal ENB through a gate terminal thereof. The inverted enable signal ENB may be a signal for controlling an activation operation of the up driving circuit 410. The inverted enable signal ENB may have an opposite phase to a non-inverted enable signal EN to be described later.

Through the above-described configuration, the up driving circuit 410 may be activated based on the inverted enable signal ENB. The up driving circuit 410 may control the up drivability reflected to the driving node N_DRV based on the up drivability control signal CTR_DRV_UP in the activated state. The up drivability may be drivability for driving the driving node N_DRV to the logic 'H' level.

Next, the down driving circuit 420 may be configured to control down drivability of the data moving path 430 based on the down drivability control signal CTR_DRV_DN. For example, the down driving circuit 420 may include first and second NMOS transistors NM1 and NM2.

The first NMOS transistor NM1 and the second NMOS transistor NM2 may be coupled in series between the driving node N_DRV and a ground voltage terminal VSS. The first NMOS transistor NM1 may receive the non-inverted enable signal EN through a gate terminal thereof. The second NMOS transistor NM2 may turn on and turn off by receiving the down drivability control signal CTR_DRV_DN through a gate terminal thereof.

Through the above-described configuration, the down driving circuit 420 may be activated based on the non-inverted enable signal EN. The down driving circuit 420 may control the down drivability reflected to the driving node N_DRV based on the down drivability control signal CTR_DRV_DN in the activated state. The down drivability may be drivability for driving the driving node N_DRV to the logic 'L' level.

Next, the data moving path 430 may be configured to output the final data DAT_FIN by receiving the synchronization data to DAT_SYN. For example, the data moving path 430 may include first to third inverting gates INV1, INV2, and INV3. The first to third inverting gates INV1 to INV3 may be coupled in series. In this example, an output terminal of the second inverting gate INV2 may be the driving node N_DRV.

Briefly, the data driving circuit 212 may be activated based on the non-inverted enable signal EN and the inverted enable signal ENB. The data driving circuit 212 may control the up drivability reflected to the driving node N_DRV based on the up drivability control signal CTR_DRV_UP. Further, the data driving circuit 212 may control the down drivability reflected to the driving node N_DRV based on the down drivability control signal CTR_DRV_DN.

Referring back to FIG. 2, the drivability control circuits 220_1 and 220_2 may include a down drivability control circuit 220_1 and an up drivability control circuit 220_2.

First, the down drivability control circuit 220_1 may be configured to activate the down drivability control signal CTR_DRV_DN based on consecutive data of a first logic level among the data patterns of the plurality of pieces of data. The first logic level may be the logic 'H' level. For example, the down drivability control circuit 220_1 may activate the down drivability control signal CTR_DRV_DN when consecutive data of the logic 'H' level are included in the data patterns of the first to fourth data DAT_I, DAT_Q, DAT_IB, and DAT_QB.

Figure 5:
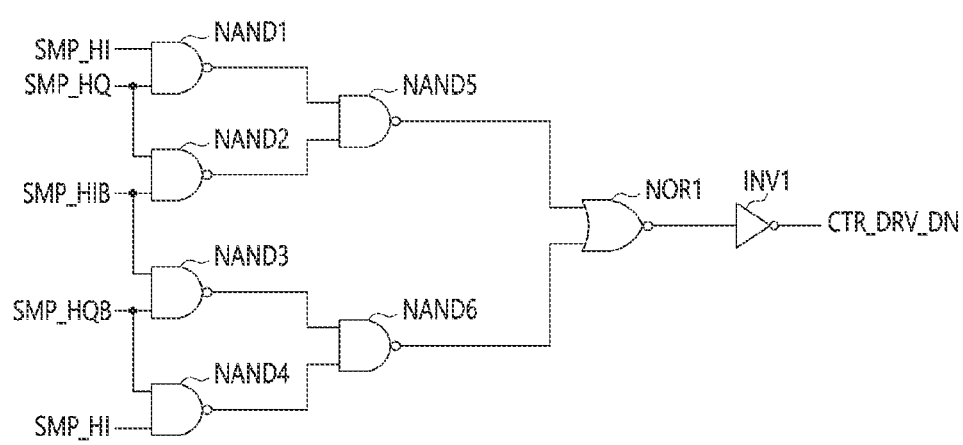
FIG. 5 is a circuit diagram illustrating a configuration of a down drivability control circuit of FIG. 2.

FIG. 5 is a circuit diagram illustrating a configuration of the down drivability control circuit 220_1 of FIG. 2.

Referring to FIG. 5, the down drivability control circuit 220_1 may generate the down drivability control signal CTR_DRV_DN by receiving the first to fourth high sampling data SMP_HI, SMP_HQ, SMP_HIB, and SMP_HQB for which the logic 'H' levels of the first to fourth data DAT_I, DAT_Q, DAT_IB, and DAT_QB are sampled. For example, the down drivability control circuit 220_1 may include first to sixth NAND gates NADN1, NAND2, NAND3, NAND4, NAND5, and NAND6, a first NOR gate NOR1, and a first inverting gate INV1.

The first NAND gate NAND1 may receive the first high sampling data SMP_HI and the second high sampling data SMP_HQ, perform an NAND operation on the first and second high sampling data SMP_HI and SMP_HQ, and output an NAND operation result as an output signal. The second NAND gate NAND2 may receive the second high sampling data SMP_HQ and the third high sampling data SMP_HIB, perform an NAND operation on the second and third high sampling data SMP_HQ and SMP_HIB, and output an NAND operation result as an output signal. The third NAND gate NAND3 may receive the third high sampling data SMP_HIB and the fourth high sampling data SMP_HQB, perform an NAND operation on the third and fourth high sampling data SMP_HIB and SMP_HQB, and output an NAND operation result as an output signal. The fourth NAND gate NAND4 may receive the fourth high sampling data SMP_HQB and the first high sampling data SMP_HI, perform an NAND operation on the fourth and first high sampling data SMP_HQB and SMP_HI, and output an NAND operation result as an output signal.

The fifth NAND gate NAND5 may receive the output signals of the first and second NAND gates NAND1 and NAND2, perform an NAND operation on the output signals of the first and second NAND gates NAND1 and NAND2, and output an NAND operation result as an output signal. The sixth NAND gate NAND6 may receive the output signals of the third and fourth NAND gates NAND3 and NAND4, perform an NAND operation on the output signals of the third and fourth NAND gates NAND3 and NAND4, and output an NAND operation result as an output signal. The first NOR gate NOR1 may receive the output signals of the fifth and sixth NAND gates NAND5 and NAND6, perform an NOR operation on the output signals of the fifth and sixth NAND gates NAND5 and NAND6, and output an NOR operation result as an output signal. The first inverting gate INV1 may receive and invert the output signal of the first NOR gate NOR1 and output an inverting result as the down drivability control signal CTR_DRV_DN.

Through the above-described configuration, the down drivability control circuit 220_1 may activate the down drivability control signal CTR_DRV_DN when consecutive data of the logic 'H' level are included in the data patterns of the first to fourth high sampling data SMP_HI, SMP_HQ, SMP_HIB, and SMP_HQB. The generated down drivability control signal CTR_DRV_DN may be provided to the down driving circuit 420 of FIG. 4.

Referring back to FIG. 2, the up drivability control circuit 220_2 may be configured to activate the up drivability control signal CTR_DRV_UP based on consecutive data of a second logic level among the data patterns of the plurality of pieces of data. The second logic level may be the logic 'L' level. For example, the up drivability control circuit 220_2 may activate the up drivability control signal CTR_DRV_UP when consecutive data of the logic 'L' level are included in the data patterns of the first to fourth data DAT_I, DAT_Q, DAT_IB, and DAT_QB.

Figure 6:
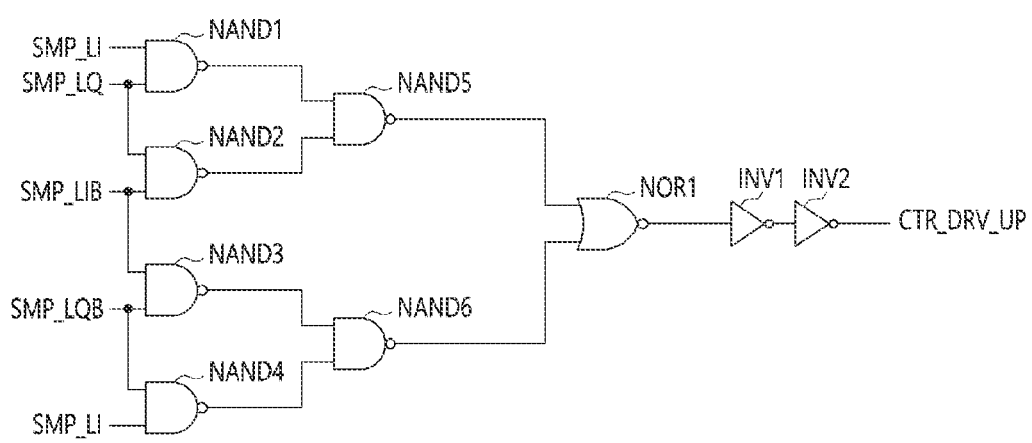
FIG. 6 is a circuit diagram illustrating a configuration of an up drivability control circuit of FIG. 2.

FIG. 6 is a circuit diagram illustrating a configuration of the up drivability control circuit 220_2 of FIG. 2.

Referring to FIG. 6, the up drivability control circuit 220_2 may generate the up drivability control signal CTR_DRV_UP by receiving the first to fourth low sampling data SMP_LI, SMP_LQ, SMP_LIB, and SMP_LQB for which the logic 'L' levels of the first to fourth data DAT_I, DAT_Q, DAT_IB, and DAT_QB are sampled. For example, the up drivability control circuit 220_2 may include first to sixth NAND gates NADN1, NAND2, NAND3, NAND4, NAND5, and NAND6, a first NOR gate NOR1, and first to second inverting gates INV1 and INV2.

The first NAND gate NAND1 may receive the first low sampling data SMP_LI and the second low sampling data SMP_LQ, perform an NAND operation on the first and second low sampling data SMP_LI and SMP_LQ, and output an NAND operation result as an output signal. The second NAND gate NAND2 may receive the second low sampling data SMP_LQ and the third low sampling data SMP_LIB, perform an NAND operation on the second and third low sampling data SMP_LQ and SMP_LIB, and output an NAND operation result as an output signal. The third NAND gate NAND3 may receive the third low sampling data SMP_LIB and the fourth low sampling data SMP_LQB, perform an NAND operation on the third and fourth low sampling data SMP_LIB and SMP_LQB, and output an NAND operation result as an output signal. The fourth NAND gate NAND4 may receive the fourth low sampling data SMP_LQB and the first low sampling data SMP_LI, perform an NAND operation on the fourth and first low sampling data SMP_LQB and SMP_LI, and output an NAND operation result as an output signal.

The fifth NAND gate NAND5 may receive the output signals of the first and second NAND gates NAND1 and NAND2, perform an NAND operation on the output signals of the first and second NAND gates NAND1 and NAND2, and output an NAND operation result as an output signal. The sixth NAND gate NAND6 may receive the output signals of the third and fourth NAND gates NAND3 and NAND4, perform an NAND operation on the output signals of the third and fourth NAND gates NAND3 and NAND4, and output an NAND operation result as an output signal. The first NOR gate NOR1 may receive the output signals of the fifth and sixth NAND gates NAND5 and NAND6, perform an NOR operation on the output signals of the fifth and sixth NAND gates NAND5 and NAND6, and output an NOR operation result as an output signal. The first inverting gate INV1 may receive and invert the output signal of the first NOR gate NOR1 and output an inverting result as an output signal. The second inverting gate INV2 may receive and invert the output signal of the first inverting gate INV1 and output an inverting result as the up drivability control signal CTR_DRV_UP. The generated up drivability control signal CTR_DRV_UP may be provided to the up driving circuit 410 of FIG. 4.

Through the above-described configuration, the up drivability control circuit 220_2 may activate the up drivability control signal CTR_DRV_UP when consecutive data of the logic 'L' level are included in the data patterns of the first to fourth low sampling data SMP_LI, SMP_LQ, SMP_LIB, and SMP_LQB.

Figure 7:
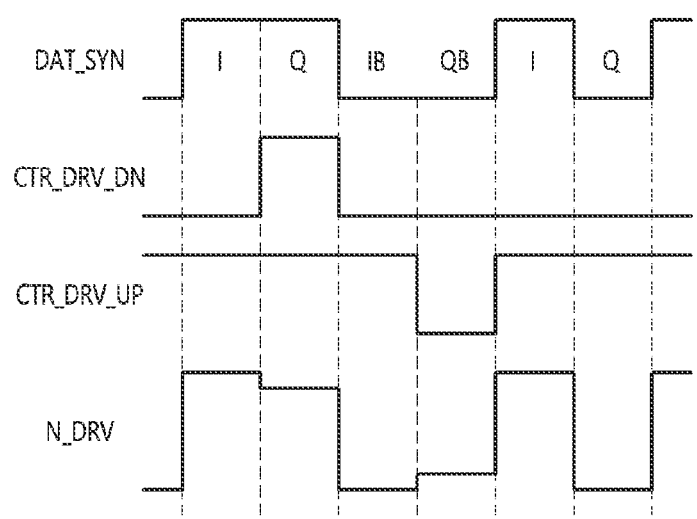
FIG. 7 is a waveform diagram for describing a circuit operation of the integrated circuit of FIG. 2.

FIG. 7 is a waveform diagram for describing a circuit operation of the integrated circuit 200 of FIG. 2.

Waveforms corresponding to the synchronization data DAT_SYN, the down drivability control signal CTR_DRV_DN, the up drivability control signal CTR_DRV_UP, and the driving node N_DRV are illustrated in FIG. 7. For clarity, for example, the first data DAT_I is represented as I, the second data DAT_Q is represented as Q, the third data DAT_IB is represented as IB, and the fourth data DAT_QB is represented as QB. The example shows the data as the first data DAT_I and the 'Q' data as the second data DAT_Q being consecutive data of the logic 'H' level, and the 'IB' data as the third data DAT_IB and the 'QB' data as the fourth data DAT_QB being consecutive data of the logic 'L' level.

As illustrated in FIG. 7, the down drivability control signal CTR_DRV_DN may be activated as the logic 'H' level based on the 'I' data and 'Q' data as the consecutive data of the logic 'H' level among the data patterns of the synchronization data DAT_SYN. When the down drivability control signal CTR_DRV_DN is activated, the down driving circuit 420 of FIG. 4 may be driven. Accordingly, the drivability reflected to drive the 'Q' data as the logic 'H' level in the driving node N_DRV may be less than the drivability reflected to drive the 'I' data as the previous data as the logic 'H' level. As a result, the slew rate for the 'IB' data of the logic 'L' level driven after the 'Q' data may be improved.

Further, as illustrated in FIG. 7, the up drivability control signal CTR_DRV_UP may be activated as the logic 'L' level based on the 'IB' data and 'QB' data as the consecutive data of the logic 'L' level among the data patterns of the synchronization data DAT_SYN. When the up drivability control signal CTR_DRV_UP is activated, the up driving circuit 410 of FIG. 4 may be driven. Accordingly, the drivability reflected to drive the 'QB' data as the logic 'L' level in the driving node N_DRV may be less than the drivability reflected to drive the 'IB' data as the previous data as the logic 'L' level. As a result, the slew rate for the 'I' data of logic 'H' level driven after the 'QB' data may be improved.

The integrated circuit 200 according to an embodiment may improve the slew rate of the final data DAT_FIN by controlling the up drivability and the down drivability according to the data patterns of the first to fourth data DAT_I, DAT_Q, DAT_IB, and DAT_QB.

Figure 8:
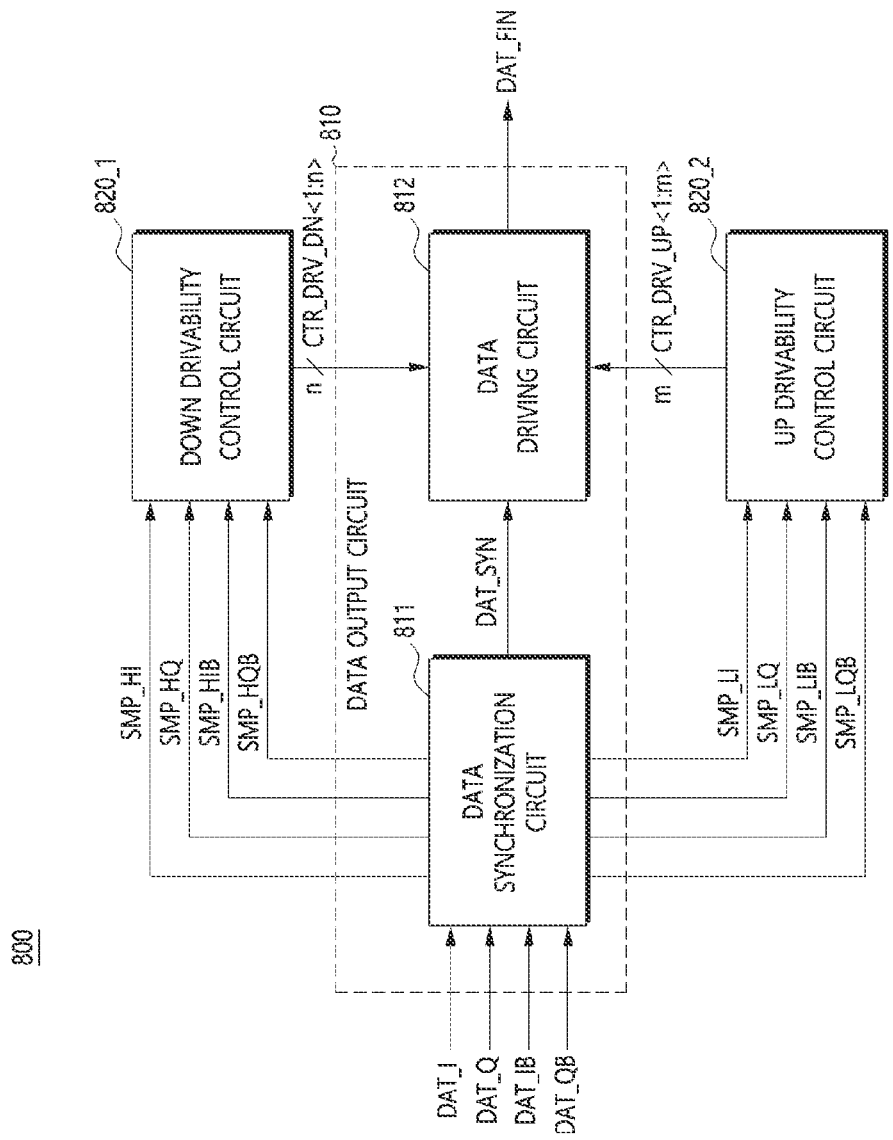
FIG. 8 is a block diagram illustrating a configuration of an integrated circuit according to an embodiment of the present disclosure.

FIG. 8 is a block diagram illustrating a configuration of an integrated circuit 800 according to an embodiment.

Referring to FIG. 8, the integrated circuit 800 may include a data output circuit 810 and drivability control circuits 820_1 and 820_2.

First, the data output circuit 810 may be configured to sequentially output the first to fourth data DAT_I, DAT_Q, DAT_IB, and DAT_QB based on the first to fourth phase clock signals CLK_I, CLK_Q, CLK_IB, and CLK_QB. The data output circuit 810 may receive the first to fourth data DAT_I, DAT_Q, DAT_IB, and DAT_QB and finally output the final data the DAT_FIN. The data output circuit 810 may be configured to control the drivability reflected to each of the first to fourth data DAT_I, DAT_Q, DAT_IB, and DAT_QB based on a plurality of up drivability control signals CTR_DRV_UP<1:m> (wherein m is a natural number) and a plurality of down drivability control signals CTR_DRV_DN<1:n> (wherein n is a natural number), Detailed description for the plurality of up drivability control signals CTR_DRV_UP<1:m> and the plurality of down drivability control signals CTR_DRV_DN<1:n> will be made in detail with reference to FIG. 10. The data output circuit 810 may include a data synchronization circuit 811 and a data driving circuit 812.

First, the data synchronization circuit 811 may be configured to synchronize the first to fourth data DAT_I, DAT_Q, DAT_IB, and DAT_QB based on the first to fourth phase clock signals CLK_I, CLK_Q, CLK_IB, and CLK_QB. The data synchronization circuit 811 may have the configuration corresponding to the data synchronization circuit 211 of FIGS. 2 and 3.

Next, the data driving circuit 812 may drive the is synchronization data DAT_SYN by the drivability corresponding to the plurality of up drivability control signals CTR_DRV_UP<1:m> and the plurality of down drivability control signals CTR_DRV_DN<1:n> and output the final data DAT_FIN.

Figure 9:
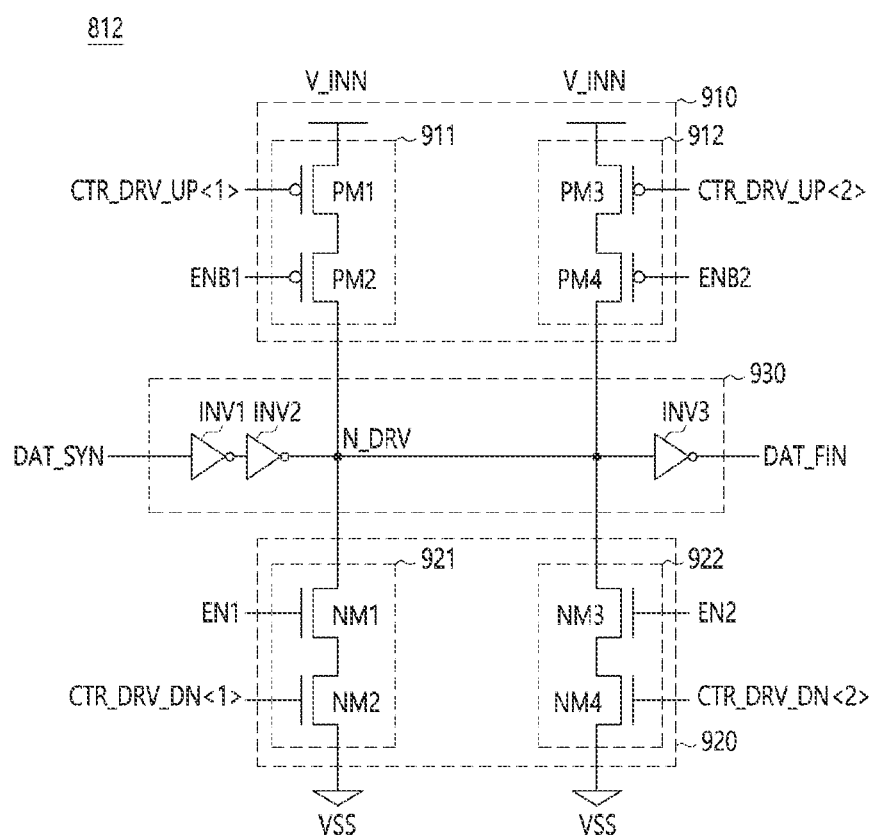
FIG. 9 is a circuit diagram illustrating a configuration of a data driving circuit of FIG. 8.

FIG. 9 is a circuit diagram illustrating a configuration of the data driving circuit 812 of FIG. 8. For clarity, for example, the number of up drivability control signals CTR_DRV_UP<1:m> and the number of down drivability control signals CTR_DRV_DN<1:n> may be 2, respectively. In this example, the plurality of up drivability control signals CTR_DRV_UP<1:m> may include first and second up drivability control signals CTR_DRV_UP<1> and CTR_DRV_UP<2>. The plurality of down drivability control signals CTR_DRV_DN<1:n> may include first and second down drivability control signals CTR_DRV_DN<1> and CTR_DRV_DN<2>.

Referring to FIG. 9, the data driving circuit 812 may include a plurality of up driving circuits 910 and a plurality of down driving circuits 920.

First, the plurality of up driving circuits 910 may be configured to control up drivability of a data moving path 930 step by step based on the first and second up drivability control signals CTR_DRV_UP<1> and CTR_DRV_UP<2>. For example, the plurality of up driving circuits 910 may include a first up driving circuit 911 and a second up driving circuit 912.

The first up driving circuit 911 may be configured to control the up drivability of the data moving path 930 based on the first up drivability control signal CTR_DRV_UP<1>. The first up driving circuit 911 may include first and second PMOS transistors PM1 and PM2. The first and second PMOS transistors PM1 and PM2 may be coupled in series between an inner power voltage terminal V_INN and a driving node N_DRV. The first up driving circuit 911 may have the configuration corresponding to the up driving circuit 410 of FIG. 4. The second up driving circuit 912 may be configured to control the up drivability of the data moving path 930 based on the second up drivability control signal CTR_DRV_UP<2>. The second up driving circuit 912 may include third and fourth PMOS transistors PM3 and PM4. The third and fourth PMOS transistors PM3 and PM4 may be coupled in series between the inner power voltage terminal V_INN and the driving node N_DRV.

For example, an activation operation of the first up driving circuit 911 may be controlled based on a first inverted enable signal ENB1. An activation operation of the second up driving circuit 912 may be controlled based on a second inverted enable signal ENB2. The first and second inverted enable signals ENB1 and ENB2 may be the same signal as each other. The first and second inverted enable signals ENB1 and ENB2 may have different operation sections from each other according to the activation of the first and second up driving circuits 911 and 912.

Next, the plurality of down driving circuits 920 may be configured to control down drivability of the data moving path 930 step by step based on the first and second down drivability control signals CTR_DRV_DN<1> and CTR_DRV_DN<2>. For example, the plurality of down driving circuits 920 may include a first down driving circuit 921 and a second down driving circuit 922.

The first down driving circuit 921 may be configured to control the down drivability of the data moving path 930 based on the first down drivability control signal CTR_DRV_DN<1>. The first down driving circuit 921 may include first and second NMOS transistors NM1 and NM2. The first and second NMOS transistors NM1 and NM2 may be coupled in series between a ground voltage terminal VSS and the driving node N_DRV. The first down driving circuit 921 may have the configuration corresponding to the down driving circuit 420 of FIG. 4. The second down driving circuit 922 may be configured to control the down drivability of the data moving path 930 based on the second down drivability control signal CTR_DRV_DN2. The second down driving circuit 922 may include third and fourth NMOS transistors NM3 and NM4. The third and fourth NMOS transistors NM3 and NM4 may be coupled in series between the ground voltage terminal VSS and the driving node N_DRV.

For example, an activation operation of the first down driving circuit 921 may be controlled based on a first non-inverted enable signal EN1. An activation operation of the second down driving circuit 922 may be controlled based on a second non-inverted enable signal EN2. Similarly, the first and second non-inverted enable signals EN1 and EN2 may be the same signal as each other. The first and second non-inverted enable signals EN1 and EN2 may have different operation sections from each other according to the activation of the first and second down driving circuits 921 and 922.

Next, the data moving path 930 may be configured to output the final data DAT_FIN by receiving the synchronization data DAT_SYN. For example, the data moving path 930 may include first to third inverting gates INV1, INV2, and INV3. The first to third inverting gates INV1 to INV3 may be coupled in series. In this example, an output terminal of the second inverting gate INV2 may be the driving node N_DRV.

Briefly, the data driving circuit 812 may be configured to control the up drivability of the driving node N_DRV step by step based on the first up drivability control signal CTR_DRV_UP<1> and the second up drivability control signal CTR_DRV_UP<2>. Further, the data driving circuit 812 may be configured to control the down drivability of the driving node N_DRV step by step based on the first down drivability control signal CTR_DRV_DN<1> and the second down drivability control signal CTR_DRV_DN<2>. Detailed description therefor will be made below in detail with reference to FIG. 13.

Referring back to FIG. 8, the drivability control circuits 820_1 and 820_2 may be configured to activate the plurality of drivability control signals corresponding to the number of consecutive data of the same logic level when consecutive data of the same logic level are included in the data patterns of the plurality of pieces of data.

For example, when three pieces of consecutive data of the logic 'H' level are included in the first to fourth data DAT_I, DAT_Q, DAT_IB, and DAT_QB, the drivability control circuits 820_1 and 820_2 may generate two down drivability control signals, for example, the first and second down drivability control signals CTR_DRV_DN<1:2>. Further, when three pieces of consecutive data of the logic 'L' level are included in the first to fourth data DAT_I, DAT_Q, DAT_IB, and DAT_QB, the drivability control circuits 820_1 and 820_2 may generate two up drivability control signals, for example, the first and second up drivability control signals CTR_DRV_UP 1:2>.

The drivability control circuits 820_1 and 820_2 may include the down drivability control circuit 820_1 and the up drivability control circuit 820_2.

First, the down drivability control circuit 820_1 may be configured to sequentially activate the first and second down drivability control signals CTR_DRV_DN<1:2> based on the number of consecutive data of the logic 'H' level among the data patterns of the first to fourth data DAT_I, DAT_Q, DAT_IB, and DAT_QB.

Figure 10:
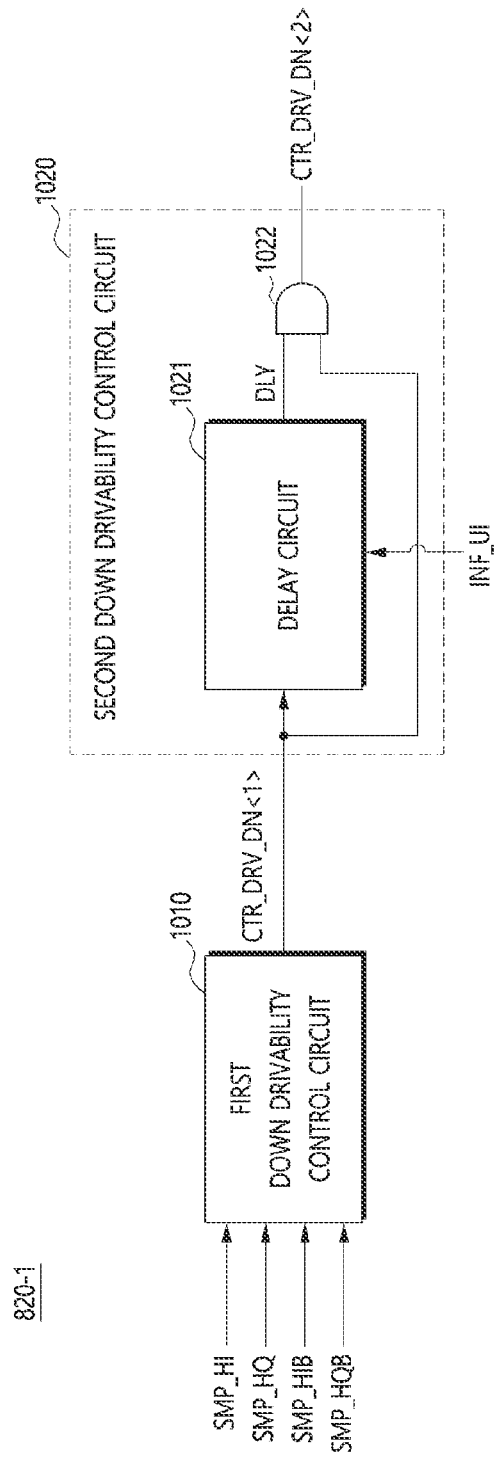
FIG. 10 is a diagram illustrating a configuration of a down drivability control circuit of FIG. 8.

FIG. 10 is a circuit diagram illustrating a configuration of the down drivability control circuit 820_1 of FIG. 8.

Referring to FIG. 10, the down drivability control circuit 820_1 may include a first down drivability control circuit 1010 and a second down drivability control circuit 1020.

First, the first down drivability control circuit 1010 may generate the first down drivability control signal CTR_DRV_DN<1> by receiving the first to fourth high sampling data SMP_HI, SMP_HQ, SMP_HIB, and SMP_HQB for which the logic 'H' levels of the first to fourth data DAT_I, DAT_Q, DAT_IB, and DAT_QB are sampled. The first down drivability control circuit 1010 may have the configuration corresponding to the down drivability control circuit 220-1 of FIGS. 2 and 5. Accordingly, the first down drivability control circuit 1010 may activate the first down drivability control signal CTR_DRV_DN<1> when consecutive data of the logic 'H' level are included in the data patterns of the first to fourth high sampling data SMP_HI, SMP_HQ, SMP_HIB, and SMP_HQB.

Next, the second down drivability control circuit 1020 may be configured to activate the second down drivability control signal CTR_DRV_DN<2> based on activation sections of the first down drivability control signal CTR_DRV_DN<1> and a delayed first down drivability control signal DLY. For example, the second down drivability control circuit 1020 may include a delay circuit 1021 and an output circuit 1022.

The delay circuit 1021 may be configured to delay the first down drivability control signal CTR_DRV_DN<1>. The delay circuit 1021 may delay the first down drivability control signal CTR_DRV_DN<1> based on delay amount information INF_UI. The delay amount information INF_UI may include a unit delay amount. For example, each of the first to fourth data DAT_I, DAT_Q, DAT_IB, and DAT_QB may have the unit delay amount corresponding to 4. For clarity, it has been illustrated in the embodiment that the delay amount information INF_UI has the unit delay amount corresponding to 1. In this example, the unit delay amount corresponding to 1 may be corresponding to a phase difference between the first phase clock signal CLK_I and the second phase dock signal CLK_Q. Accordingly, the delay circuit 1021 may receive the first down drivability control signal CTR_DRV_DN<1>, delay the first down drivability control signal CTR_DRV_DN<1> by the unit delay amount corresponding to 1, and output the delay result as the delayed first down drivability control signal DLY.

The output circuit 1022 may generate the second down drivability control signal CTR_DRV_DN<2> based on an overlapping section of the activation sections of the first down drivability control signal CTR_DRV_DN<1> and the delayed first down drivability control signal DLY. The output circuit 1022 may include an AND gate. The output circuit 1022 may perform an AND operation on the first down drivability control signal CTR_DRV_DN<1> and the delayed first down drivability control signal DLY and output an AND operation result as the second down drivability control signal CTR_DRV_DN<2>.

Although not shown in drawings, when a plurality of second down drivability control circuits 1020 are consecutively coupled in series, a plurality of down drivability control signals corresponding thereto may be generated.

Figure 11:
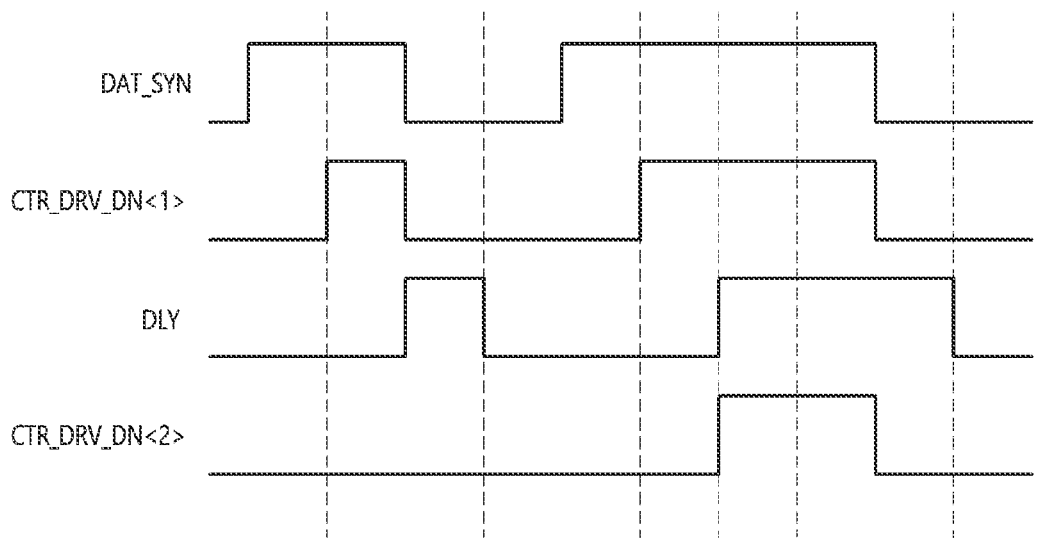
FIG. 11 is a waveform diagram for describing a circuit operation of the down drivability control circuit of FIG. 10.

FIG. 11 is a waveform diagram for describing a circuit operation of the down drivability circuit 820_1 of FIG. 10.

For clarity, an example waveform corresponding to the synchronization data DAT_SYN is illustrated in FIG. 11. Further, waveforms corresponding to the first down drivability control signal CTR_DRV_DN<1>, the delayed first down drivability control signal DLY, and the second down drivability control signal CTR_DRV_DN<2> are illustrated in FIG. 11.

Referring to FIGS. 10 and 11, the first down drivability control signal CTR_DRV_DN<1> may be activated based on the consecutive data of the logic 'H' level among the data patterns of the synchronization data DAT_SYN. Detailed description therefor has been made in detail, and thus will be omitted.

The delay circuit 1021 may receive and delay the first down drivability control signal CTR_DRV_DN<1> by the unit delay amount corresponding to 1, and output a delayed result as the delayed first down drivability control signal DIY. Subsequently, the output circuit 1022 generate the second down drivability control signal CTR_DRV_DN<2> by performing an AND operation on the first down drivability control signal CTR_DRV_DN<1> and the delayed first down drivability control signal DLY. Accordingly, the second down drivability control signal CTR_DRV_DN<2> may have the activation to section corresponding to the overlapping section of the activation sections of the first down drivability control signal CTR_DRV_DN<1> and the delayed first down drivability control signal DLY.

As shown in FIG. 11, the first down drivability control signal CTR_DRV_DN<1> may be activated when the number of consecutive data of the logic 'H' level among the data patterns of the synchronization data DAT_SYN is 2. Further, the first down drivability control signal CTR_DRV_DN<1> and the second down drivability control signal CTR_DRV_DN<2> may be sequentially activated when the number of consecutive data of the logic 'H' level among the data patterns of the synchronization data DAT_SYN is 3. The generated first and second down drivability control signals CTR_DRV_DN<1:2> may be provided to the first and second down driving circuits 921 and 922 of FIG. 9 to control the down drivability reflected to the driving node N_DRV step by step.

Referring back to FIG. 8, the up drivability control circuit 820_2 may be configured to sequentially activate the first and second up drivability control signals CTR_DRV_UP<1:2> based on the number of consecutive data of the logic 'L' level among the data patterns of the first to fourth data DAT_I, DAT_Q, DAT_IB, and DAT_QB. For example, the up drivability control circuit 820_2 may generate the first and second up drivability control signals CTR_DRV_UP<1:2> by receiving the first to fourth low sampling data SMP_LI, SMP_Q, SMP_LIB, and SMP_LQB for which the logic 'L' levels of the first to fourth data DAT_I, DAT_Q, DAT_IB, and DAT_QB to are sampled.

The up drivability control circuit 820_2 may have the similar internal configuration to the down drivability control circuit 8201 of FIG. 10, and thus for clarity, detailed description therefor will be omitted. The up drivability control circuit 820_2 may generate the first and second up drivability control signals CTR_DRV_UP<1:2> by receiving the first to fourth low sampling data SMP_LI, SMP_LQ, SMP_LIB, and SMP_LQB. For example, the output circuit 1022 of FIG. 10 which outputs the second up drivability control signal CTR_DRV_UP<2> may include an OR gate.

Although not shown in FIG. 11, the first up drivability control signal CTR_DRV_UP<1> may be activated when the number of consecutive data of the logic 'L' level among the data patterns of the synchronization data DAT_SYN is 2. The first up drivability control signal CTR_DRV_UP<1> and the second up drivability control signal CTR_DRV_UP<2> may be sequentially activated when the number of consecutive data of the logic level among the data patterns of the synchronization data DAT_SYN is 3. The generated first and second up drivability control signals CTR_DRV_UP<1:2> may be provided to the first and second up driving circuits 911 and 912 of FIG. 9 to control the up drivability reflected to the driving node N_DRV step by step.

Figure 12:
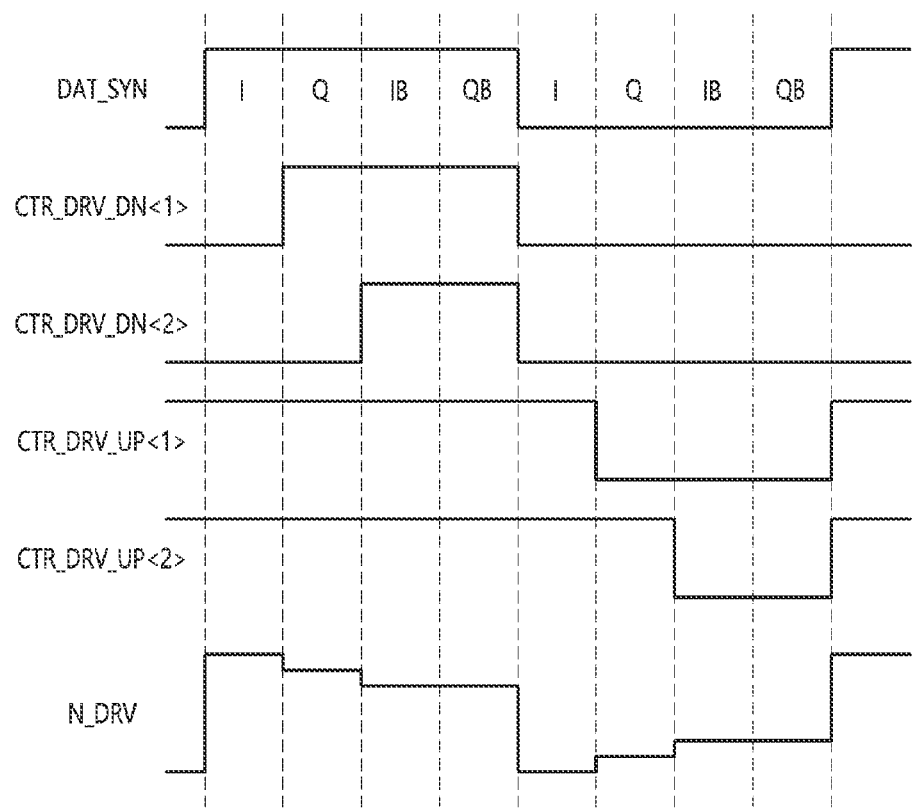
FIG. 12 is a waveform diagram for describing a circuit operation of the integrated circuit of FIG. 8.

FIG. 12 is a waveform diagram for describing a circuit operation of the integrated circuit 800 of FIG. 8.

Waveforms corresponding to the synchronization data DAT_SYN, the first down drivability control signal CTR_DRV_DN<1>, the second down drivability control signal CTR_DRV_DN<2>, the first up drivability control signal CTR_DRV_UP<1>, the second up drivability control signal CTR_DRV_UP<2>, and the driving node N_DRV are illustrated in FIG. 12. For clarity, the examples that all 'I' data, 'Q' data, 'IB' data, and 'QB' data as the first to fourth data DAT_I, DAT_Q, DAT_IB, and DAT_QB are logic 'H' levels and logic 'L' levels are illustrated in FIG. 12.

As illustrated in FIG. 12, the first and second down drivability control signals CTR_DRV_DN<1:2> may be sequentially activated according to the number of consecutive data of the logic 'H' level among the data patterns of the synchronization data DAT_SYN, Accordingly, the up drivability reflected to drive the 'I', 'Q', 'IB', and 'QB' data as the logic 'H' level in the driving node N_DRV may be reduced step by step. As a result, the slew rate for the data of the logic 'L' level driven after the 'QB' data of the logic 'H' level may be improved.

Further, as illustrated in FIG. 12, the first and second up drivability control signals CTR_DRV_UP<1:2> may be sequentially activated according to the number of consecutive data of the logic 'L' level among the data patterns of the synchronization data DAT_SYN. Accordingly, the down drivability reflected to drive the I, Q, IB, and QB data as the logic 'L' level in the driving node N_DRV may be reduced step by step. As a result, the slew rate for the data of logic 'H' level driven after the 'QB' data of the logic 'L' level may be improved.

The integrated circuit 800 according to an embodiment may improve the slew rate of the final data DAT_FIN by controlling the up drivability and the down drivability step by step according to the data patterns of the first to fourth data DAT_I, DAT_Q, DAT_IB, and DAT_QB.

Figure 13:
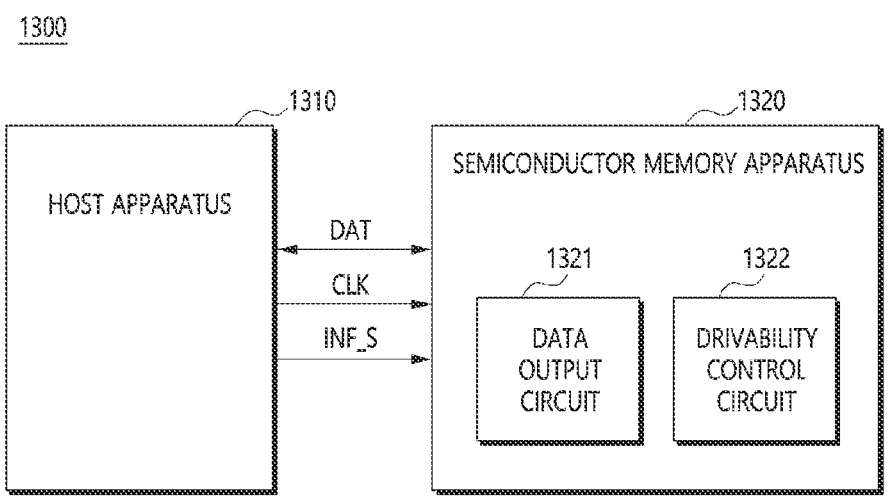
FIG. 13 is a block diagram illustrating a semiconductor memory system according to an embodiment of the present disclosure.

FIG. 13 is a block diagram illustrating a semiconductor memory system 1300 according to an embodiment.

Referring to FIG. 13, the semiconductor memory system 1300 may include a host apparatus 1310 and a semiconductor memory apparatus 1320.

The host apparatus 1310 may be configured to provide the step setting information INF_S. For example, the step setting information INF_S may be information corresponding to the driving control step of the up drivability and the down drivability described above. Detailed description for the step setting information INF_S will made below in detail with reference to FIG. 14. Subsequently, the host apparatus 1310 may provide data DAT and a dock signal CLK to the semiconductor memory apparatus 1320. The host apparatus 1310 may receive processed data DAT from the semiconductor memory apparatus 1320.

The semiconductor memory apparatus 1320 may include a data output circuit 1321 and a drivability control circuit 1322 as described in FIGS. 1 to 12. For example, the data output circuit 1321 and the drivability control circuit 1322 may correspond to the data output circuit 810 and the drivability control circuits 820_1 and 820_2 of FIG. 8.

When consecutive data of the same logic level are included in the data patterns of the plurality of pieces of data, the drivability control circuits 820_1 and 820_2 of FIG. 8 corresponding to the drivability control circuit 1322 may be configured to activate a plurality of drivability control signals corresponding to the number of consecutive data of the same logic level and the step setting information. For example, the step setting information INF_S may be input other than the delay amount information INF_UI of FIG. 10. As described above in FIG. 10, the delay amount information INF_UI may be information for delaying the first down drivability control signal CTR_DRV_DN<1> by the unit delay amount corresponding to 1. Accordingly, the first down drivability control signal CTR_DRV_DN<1> may be delayed by a delay amount corresponding to the step setting information INF_S.

Figure 14:
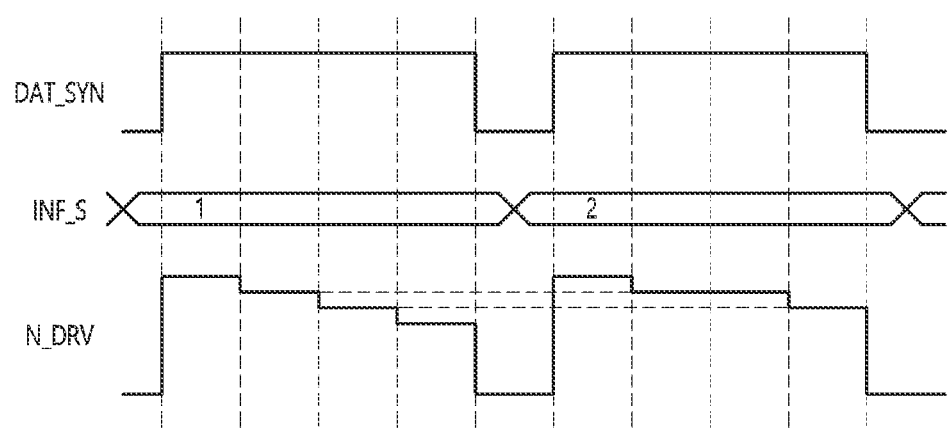
FIG. 14 is a waveform diagram for describing a circuit operation of the semiconductor memory system of FIG. 13.

FIG. 14 is a waveform diagram for describing a circuit operation of the semiconductor memory system 1300 of FIG. 13.

For clarity, an example waveform corresponding to the synchronization data DAT_SYN is illustrated in FIG. 14. For example, the synchronization data DAT_SYN for which four pieces of data of the logic 'H' level are consecutively input and then four pieces of data of logic 'H' level are consecutively input again is illustrated in FIG. 14. Further, a waveform corresponding to the step setting information INF_S is illustrated in FIG. 14. The example that the step setting information INF_S is '1' and '2' is illustrated in FIG. 14. A waveform corresponding to the driving node N_DRV (not shown in FIG. 13) formed in the data output circuit 1321 is illustrated in FIG. 14. For example, the driving node N_DRV may correspond to the driving node N_DRV of FIG. 9.

As described above in FIG. 10, the down drivability control signal may be designed to include a plurality of down drivability control signals according to the design. For example, a maximum of three down drivability control signals may be generated. In this example, the plurality of down drivability control signals may include first to third down drivability control signals CTR_DRV_DN<1:3>.

First, when the step setting information INF_S is '1', the delay circuit 1021 of FIG. 10 may perform a delay operation by the unit delay amount corresponding to 1. Accordingly, a delay difference corresponding to 1 may be generated between the first down drivability control signal CTR_DRV_DN<1> and the second down drivability control signal CTR_DRV_DN<2>. A delay difference corresponding to 1 may also be generated between the second down drivability control signal CTR_DRV_DN<2> and the third down drivability control signal CTR_DRV_DN<3>. Accordingly, the up drivability reflected to the driving node N_DRV may be reduced step by step based on the first to third down drivability control signals CTR_DRV_DN<1:3>. As illustrated in FIG. 14, when the step setting information INF_S is '1', the up drivability control step for the driving node N_DRV may be set to four steps.

Next, when the step setting information INF_S is '2', the delay circuit 1021 of FIG. 10 may perform a delay operation by the unit delay amount corresponding to '2'. Accordingly, a delay difference corresponding to 2 may be generated between the first down drivability control signal CTR_DRV_DN<1> and the second down drivability control signal CTR_DRV_DN<2>. At this time, because the number of consecutive data is smaller than 4, the third down drivability control signal CTR_DRV_DN<3> might not be activated. Accordingly, the up drivability reflected to the driving node N_DRV may be reduced step by step based on the first to second down drivability control signals CTR_DRV_DN<1:2>, As illustrated in FIG. 14, when the step setting information INF_S is '2', the up drivability control step for the driving node N_DRV may be set to three steps.

Similarly, the down drivability control step for the down drivability reflected to the driving node N_DRV may also be set based on the step setting information INF_S. The circuit operation for setting the down drivability control step may be similar to the circuit operation for setting the up drivability control step, and thus detailed description therefor will be omitted.

The semiconductor memory system 1300 according to an embodiment may control the up drivability control step corresponding to the up drivability of the semiconductor memory apparatus 1320 and the down drivability control step corresponding to the down drivability of the semiconductor memory apparatus 1320 based on the step setting information INF_S. Accordingly, the up/down drivability control step of the semiconductor memory apparatus 1320 may be stably controlled, and thus reliable circuit operation may be achieved.

The above described embodiments of the present teachings are intended to illustrate and not to limit the present invention. Various alternatives and equivalents are possible. The present teachings are not limited by the embodiments described herein. Nor are the present teachings limited to any specific type of semiconductor device. Other additions, subtractions, or modifications are obvious in view of the present disclosure and are intended to fall within the scope of the appended claims.

What is claimed is:

1. An integrated circuit comprising:
a drivability control circuit configured to input a plurality of pieces of data through a data input terminal and generate a drivability control signal corresponding to each of the plurality of pieces of data based on data patterns of the plurality of pieces of data; and
a data output circuit configured to input the plurality of pieces of data through the data input terminal, input an internal clock signal and output the plurality of pieces of data sequentially through an data output terminal based on the internal clock signal and control drivability, which is reflected to each of the plurality of pieces of data, based on the drivability control signal.

2. The integrated circuit of claim 1, wherein the internal clock signal includes a plurality of phase clock signals corresponding to the plurality of pieces of data and having different phases from each other.

3. The integrated circuit of claim 2, wherein the data output circuit includes:
a data synchronization circuit configured to synchronize the plurality of pieces of data based on the plurality of phase clock signals; and
a data driving circuit configured to drive and output an output signal of the data synchronization circuit by drivability corresponding to the drivability control signal.

4. The integrated circuit of claim 3, wherein the data synchronization circuit includes:
a sampling circuit configured to sample the plurality of pieces of data by the plurality of phase clock signals to generate a plurality of pieces of sampling data corresponding to logic levels of the plurality of pieces of data; and
a coupling circuit configured to couple an output signal of the sampling circuit to output synchronization data.

5. The integrated circuit of claim 3, wherein the drivability control signal includes an up drivability control signal and a down drivability control signal, and wherein the data driving circuit includes:
an up driving circuit configured to control up drivability of a data moving path based on the up drivability control signal; and
a down driving circuit configured to control down drivability of the data moving path based on the down drivability control signal.

6. The integrated circuit of claim 1, wherein the drivability control signal includes an up drivability control signal and a down drivability control signal, and wherein the drivability control circuit includes:
a down drivability control circuit configured to activate the down drivability control signal based on consecutive data of a first logic level among the data patterns of the plurality of pieces of data; and
an up drivability control circuit configured to activate the up drivability control signal based on consecutive data of a second logic level among the data patterns of the plurality of pieces of data.

7. The integrated circuit of claim 3, wherein the drivability control circuit is configured to activate, when consecutive data of the same logic level are included in the data patterns of the plurality of pieces of data, a plurality of drivability control signals corresponding a number of consecutive data of the same logic level.

8. The integrated circuit of claim 7, wherein the plurality of drivability control signals include a plurality of up drivability control signals and a plurality of down drivability control signals, and wherein the data driving circuit includes:
a plurality of up driving circuits configured to control up drivability of a data moving path step by step based on the plurality of up drivability control signals; and
a plurality of down driving circuits configured to control down drivability of the data moving path step by step based on the plurality of down drivability control signals.

9. The integrated circuit of claim 7, wherein the plurality of drivability control signals include a plurality of up drivability control signals and a plurality of down drivability control signals, and wherein the drivability control circuit includes:
a down drivability control circuit configured to sequentially activate the plurality of down drivability control signals based on a number of consecutive data of a first logic level among the data patterns of the plurality of pieces of data; and
an up drivability control circuit configured to sequentially activate the plurality of up drivability control signals based on a number of consecutive data of a second logic level among the data patterns of the plurality of pieces of data.

10. The integrated circuit of claim 9, wherein the plurality of down drivability control signals include first and second down drivability control signals, and wherein the down drivability control circuit includes:
a first down drivability control circuit configured to activate the first down drivability control signal based on the consecutive data of the first logic level among the data patterns of the plurality of pieces of data; and
a second down drivability control circuit configured to activate the second down drivability control signal based on activation sections of the first down drivability control signal and a delayed first down drivability control signal.

11. The integrated circuit of claim 10, wherein the second down drivability control circuit includes:
a delay circuit configured to delay the first down drivability control signal and output the delayed first down drivability control signal; and
an output circuit configured to generate the second down drivability control signal based on an overlapping section of the activation sections of the first down drivability control signal and the delayed first down drivability control signal output from the delay circuit.

12. The integrated circuit of claim 9, wherein the plurality of up drivability control signals include first and second up drivability control signals, and wherein the up drivability control circuit includes:
a first up drivability control circuit configured to activate the first up drivability control signal based on the consecutive data of the second logic level among the data patterns of the plurality of pieces of data; and
a second up drivability control circuit configured to activate the second up drivability control signal based on activation sections of the first up drivability control signal and a delayed first up drivability control signal.

13. The integrated circuit of claim 12, wherein the second up drivability control circuit includes:
a delay circuit configured to delay the first up drivability control signal and output the delayed first up drivability control signal; and
an output circuit configured to generate the second up drivability control signal based on an overlapping section of the activation sections of the first up drivability control signal and the delayed first up drivability control signal output from the delay circuit.

14. A semiconductor memory system comprising:
a host apparatus configured to output step setting information; and
a semiconductor memory apparatus coupled to the host including:
a drivability control circuit configured to input a plurality of pieces of data through a data input terminal, input the step setting information and generate a drivability control signal corresponding to each of the plurality of pieces of data based on data patterns of the plurality of pieces of data, wherein a drivability control step of the semiconductor memory apparatus is set based on the step setting information; and
a data output circuit configured to input the plurality of pieces of data through the data input terminal, input an internal clock signal and output the plurality of pieces of data sequentially through an data output terminal based on the internal clock signal and control drivability, which is reflected to each of the plurality of pieces of data, based on the drivability control signal.

15. The semiconductor memory system of claim 14, wherein the drivability control circuit is configured to activate, when consecutive data of the same logic level are included in the data patterns of the plurality of pieces of data, a plurality of drivability control signals corresponding to a number of consecutive data of the same logic level and the step setting information.

16. The semiconductor memory system of claim 15, wherein the plurality of drivability control signals include a plurality of up drivability control signals and a plurality of down drivability control signals, and wherein the data output circuit includes:

a plurality of up driving circuits configured to control up drivability of a data moving path step by step based on the plurality of up drivability control signals; and a plurality of down driving circuits configured to control down drivability of the data moving path step by step based on the plurality of down drivability control signals.

17. The semiconductor memory system of claim 15, wherein the plurality of drivability control signals include a plurality of up drivability control signals and a plurality of down drivability control signals, and wherein the drivability control circuit includes:

a down drivability control circuit configured to sequentially activate the plurality of down drivability control signals based on a number of consecutive data of a first logic level among the data patterns of the plurality of pieces of data and the step setting information; and an up drivability control circuit configured to sequentially activate the plurality of up drivability control signals based on a number of consecutive data of a second logic level among the data patterns of the plurality of pieces of data and the step setting information.

18. The semiconductor memory system of claim 14, wherein the drivability control circuit includes a delay circuit configured to perform a delay operation on the drivability control signal based on the step setting information.

* * * * *